United States Patent
Lin (10) Patent No.: US 8,406,077 B2
(45) Date of Patent: Mar. 26, 2013

(54) MULTI-VOLTAGE LEVEL, MULTI-DYNAMIC CIRCUIT STRUCTURE DEVICE

(75) Inventor: Jentsung Ken Lin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 252 days.

(21) Appl. No.: 12/828,719

(22) Filed: Jul. 1, 2010

(65) Prior Publication Data

US 2012/0002500 A1  Jan. 5, 2012

(51) Int. Cl.
*G11C 8/00*  (2006.01)
(52) U.S. Cl. ......... 365/230.01; 365/189.11; 365/189.12; 365/239; 326/98; 326/112; 326/119
(58) Field of Classification Search ............ 365/189.11, 365/189.12, 189.06, 189.02, 204, 185.13, 365/185.25, 230.01; 326/95, 83, 112, 98, 326/119
See application file for complete search history.

(56) References Cited

U.S. PATENT DOCUMENTS

| | | | |
|---|---|---|---|
| 6,046,606 A | | 4/2000 | Chu et al. |
| 6,049,231 A | * | 4/2000 | Bosshart .................... 326/98 |
| 6,236,240 B1 | * | 5/2001 | Hill ............................ 326/98 |
| 6,404,235 B1 | | 6/2002 | Nowka et al. |
| 6,894,528 B2 | | 5/2005 | Gauthier et al. |
| 7,002,375 B2 | | 2/2006 | Hsu et al. |
| 7,202,704 B2 | | 4/2007 | Chu et al. |
| 7,307,457 B2 | | 12/2007 | Braceras et al. |
| 7,362,621 B2 | | 4/2008 | Chatterjee et al. |
| 7,573,300 B2 | | 8/2009 | Abadeer et al. |
| 7,830,178 B2 | * | 11/2010 | Sasagawa ............... 326/97 |
| 2003/0141899 A1 | | 7/2003 | Tzartzanis et al. |
| 2006/0001442 A1 | | 1/2006 | Wood et al. |
| 2006/0082388 A1 | * | 4/2006 | Bjorksten et al. ........... 326/95 |
| 2009/0096485 A1 | | 4/2009 | Marshall |

FOREIGN PATENT DOCUMENTS

WO  WO2006025025 A1  3/2006

OTHER PUBLICATIONS

Cornelius, Claas et al. "Dynamic Circuit Techniques in Deep Submicron Technologies: Domino Logic Reconsidered," IEEE International Conference on Integrated Circuit Design and Technology, Padova, Italy, 2006, 4 pages.
Dadgour, Hamed F. "A Novel Variation-Aware Low-Power Keeper Architecture for Wide Fan-In Dynamic Gates," Design Automation Conference, Jul. 24-28, 2006, San Francisco, CA, pp. 977-982.
Kulkarni, Jaydeep Prakash et al. "A Low Power High Performance Multiplexed Keeper Technique," ECE Department, Purdue University, West Lafayette, IN, Feb. 2006, 10 pages.
U.S. Appl. No. 12/701,754, entitled "Voltage Level Shifter with Dynamic Circuit Structure Having Discharge Delay Tracking,", filed Feb. 8, 2010.
International Search Report and Written Opinion—PCT/US2011/042486—ISA/EPO—Dec. 19, 2011.

* cited by examiner

*Primary Examiner* — Pho M Luu
*Assistant Examiner* — Thao Bui
(74) *Attorney, Agent, or Firm* — Peter M. Kamarchik; Nicholas J. Pauley; Jonathan T. Velasco (57) ABSTRACT

In a particular embodiment, a method includes discharging a first dynamic node at a first discharge circuit of a first dynamic circuit structure in response to receiving an asserted discharge signal. The first dynamic circuit structure includes the first dynamic node at a first voltage level and a first keeper circuit that is disabled when the asserted discharge signal is received. The asserted discharge signal has a second voltage level that is different from the first voltage level. A second keeper circuit of a second dynamic circuit structure is enabled responsive to discharging the first dynamic node to maintain a second dynamic node of the second dynamic circuit structure at the first voltage level.

22 Claims, 6 Drawing Sheets

MULTI-VOLTAGE LEVEL, MULTI-DYNAMIC CIRCUIT STRUCTURE DEVICE

I. FIELD

The present disclosure is generally related to dynamic circuit structures.

II. DESCRIPTION OF RELATED ART

Advances in technology have resulted in smaller and more powerful personal computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Many such wireless telephones incorporate additional devices to provide enhanced functionality for end users. For example, a wireless telephone can also include a digital still camera, a digital video camera, a digital recorder, and an audio file player. Each of these portable personal computing devices may include a variety of different electronic devices all of which consume some amount of power.

Integrated circuits used in portable personal computing devices may employ multiple voltage domains. For example, circuitry in a "high" voltage domain can operate with higher supply voltage (Vdd_H) than circuitry in a "low" voltage domain that operates using a lower supply voltage (Vdd_L). To illustrate, logic circuitry may operate at a lower supply voltage than core memory circuitry.

Voltage level shifters operate to convert a signal from a voltage level corresponding to a logic level (i.e. a logic "high" or a logic "low" signal) in one voltage domain to a voltage level corresponding to the logic level in another voltage domain. Conventionally, a voltage level shifter is designed based on the specific values of the supply voltages of the voltage domains and/or a difference between the supply voltages. It would be advantageous to provide a voltage level shifter capable of operation across a range of voltage domains.

III. SUMMARY

A group of dynamic circuits operate as a voltage level shifter. The dynamic circuits are initialized and an input signal from a first voltage domain is provided to a selected one of the dynamic circuits in a second voltage domain. The input signal causes a dynamic node of the selected dynamic circuit to discharge, generating an output signal in the second voltage domain. In response to the discharge of the dynamic node of the selected dynamic circuit, keeper circuits at the other dynamic circuits are enabled to prevent discharging of dynamic nodes at the other dynamic circuits due to leakage current from NFET pull-down devices. The voltage level of the output signal is shifted compared to the voltage level of the input signal.

In a particular embodiment, an apparatus includes a first dynamic circuit structure and a second dynamic circuit structure configured to receive a discharge signal. The first dynamic circuit includes a first keeper circuit, a first discharge circuit, and a first precharge circuit. The first keeper circuit, the first discharge circuit, and the first precharge circuit are coupled to a first dynamic node. The first precharge circuit is configured to precharge the first dynamic node to a precharge voltage level. The second dynamic circuit structure includes a second keeper circuit, a second discharge circuit, and a second precharge circuit. The second keeper circuit, the second discharge circuit, and the second precharge circuit are coupled to a second dynamic node. The second keeper circuit is coupled to the first dynamic node. The first dynamic circuit structure receives the asserted discharge signal during a discharge time period. The asserted discharge signal includes a voltage level (e.g. Vdd_L) that is different than the precharge voltage level (e.g. Vdd_H).

In another particular embodiment, the apparatus includes a plurality of dynamic circuit structures. Each dynamic circuit structure of the plurality of dynamic circuit structures includes a dynamic node configured to be precharged to a precharge voltage level, a keeper circuit, a discharge circuit, and a precharge circuit. The dynamic node of a first dynamic circuit structure of the plurality of dynamic circuit structures is coupled to the keeper circuit of each of the other dynamic circuit structures of the plurality of dynamic circuit structures. A single one of the plurality of dynamic circuit structures receives an asserted discharge signal during a discharge time period. The asserted discharge signal is at a discharge voltage level that is different than the precharge voltage level.

In another particular embodiment, a method is disclosed that includes receiving a discharge signal at a first discharge circuit of a first dynamic circuit structure. The discharge signal has a first voltage level (e.g. Vdd_H). The first dynamic circuit structure includes a first dynamic node and a first keeper circuit, and the first dynamic node has a second voltage level (e.g. Vdd_H) that is different from the first voltage level. The first keeper circuit is disabled when the discharge signal is received. The method includes discharging the first dynamic node in response to receiving the discharge signal. The method also includes enabling a second keeper circuit of a second dynamic circuit structure in response to discharging the first dynamic node to maintain a second dynamic node of the second dynamic circuit structure at the second voltage level.

One particular advantage provided by at least one of the disclosed embodiments is that a keeper circuit of a dynamic circuit structure is not enabled during discharge of a dynamic node of the dynamic circuit structure. Thus, contention between the discharge circuit and the keeper circuit during discharge of the dynamic node is reduced, or in some cases, eliminated. As a result, power consumption of the dynamic circuit structure during discharge of the dynamic node decreases, the speed at which the dynamic node discharges increases, and the level shifter can operate at a lower Vdd_L level.

V. DETAILED DESCRIPTION

Figure 1:
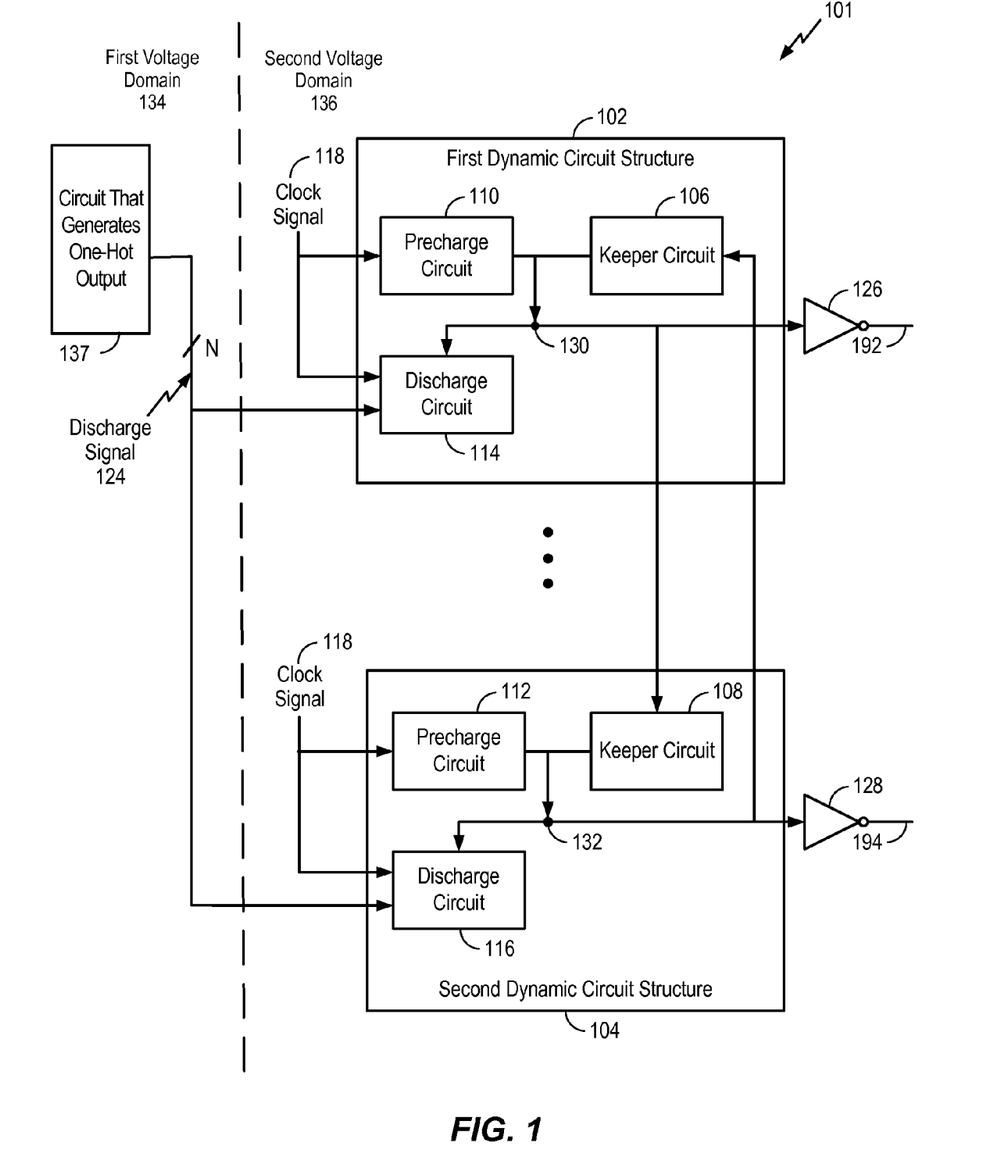
FIG. 1 is a block diagram of a first illustrative embodiment of a system including dynamic circuit structures operating at multiple voltage levels.

Referring to FIG. 1, a first embodiment of a system that includes multi-voltage level dynamic circuit structures is depicted. The system of FIG. 1 includes a circuit 137 that generates one-hot output in a first voltage domain 134 coupled to a plurality of dynamic circuit structures 101 in a second voltage domain 136 including a representative first dynamic circuit structure 102 and a representative second dynamic circuit structure 104. The first dynamic circuit structure 102 includes a first precharge circuit 110, a first discharge circuit 114, and a first keeper circuit 106 coupled at a first dynamic node 130. The second dynamic circuit structure 104 includes a second precharge circuit 112, a second discharge circuit 116, and a second keeper circuit 108 coupled at a second dynamic node 132. The first keeper circuit 106 is coupled to the second dynamic node 132 of the second dynamic circuit structure 104. The second keeper circuit 108 is coupled to the first dynamic node 130 of the first dynamic circuit structure 102. The plurality of dynamic circuit structures 101 operates as a level shifter that shifts a one-hot discharge signal 124 from the first voltage domain 134 to an output signal 192 or 194 corresponding to the second voltage domain 136.

The circuit 137 (which may be a one-hot decoder circuit) is configured to generate the discharge signal 124 as a one-hot signal. For example, the one-hot decoder circuit 127 may be coupled to a bus having N lines, and each line of the bus may be coupled to a separate discharge circuit 114, 116. The circuit 137 that generates one-hot output may assert a single line of the N-line bus and leave all remaining lines unasserted. The discharge signal 124 may therefore include multiple individual signals, only one of which is asserted at a time, that are provided to the plurality of dynamic circuit structures 101.

The first dynamic circuit structure 102 is configured to provide an output 192 via the first dynamic node 130 and an inverter 126. The output 192 is provided in response to a clock signal 118 from the second voltage domain 136 and the discharge signal 124 from the first voltage domain 134. Signals received from a voltage domain may be at a voltage level within a particular range of voltage levels. For example, the first voltage domain 134 may include a range of voltage levels from a ground reference voltage (0 Volts) to Vdd_L and the second voltage domain 136 may include a range of voltage levels from the ground reference voltage to Vdd_H, where Vdd_H is greater than Vdd_L.

The first precharge circuit 110 receives the clock signal 118 as an input and either couples or decouples the first dynamic node 130 to a voltage supply in response to the input. The first discharge circuit 114 is configured to discharge the first dynamic node 130 responsive to the clock signal 118 and the discharge signal 124. The first keeper circuit 106 is responsive to a voltage at the second dynamic node 132 as an input and either couples or decouples the first dynamic node 130 to the voltage supply in response to the input. For example, the first keeper circuit 106 couples the first dynamic node 130 to the voltage supply when the second dynamic node 132 is discharged. As used herein, a node is "discharged" when a voltage at the node transitions from a logic high voltage level to substantially zero volts, i.e. a ground value.

The second dynamic circuit structure 104 is configured to provide an output 194 via the second dynamic node 132 and an inverter 128 in response to the clock signal 118 and the discharge signal 124. The second precharge circuit 112 receives the clock signal 118 as an input and either couples or decouples the second dynamic node 132 to a voltage supply in response to the input. The second discharge circuit 116 is configured to discharge the second dynamic node 132 responsive to the clock signal 118 and the discharge signal 124. The second keeper circuit 108 is responsive to a voltage at the first dynamic node 130 as an input and either couples or decouples the second dynamic node 132 to the voltage supply in response to the input. For example, the second keeper circuit 108 couples the second dynamic node 132 to the voltage supply when the first dynamic node 130 is discharged.

Figure 2:
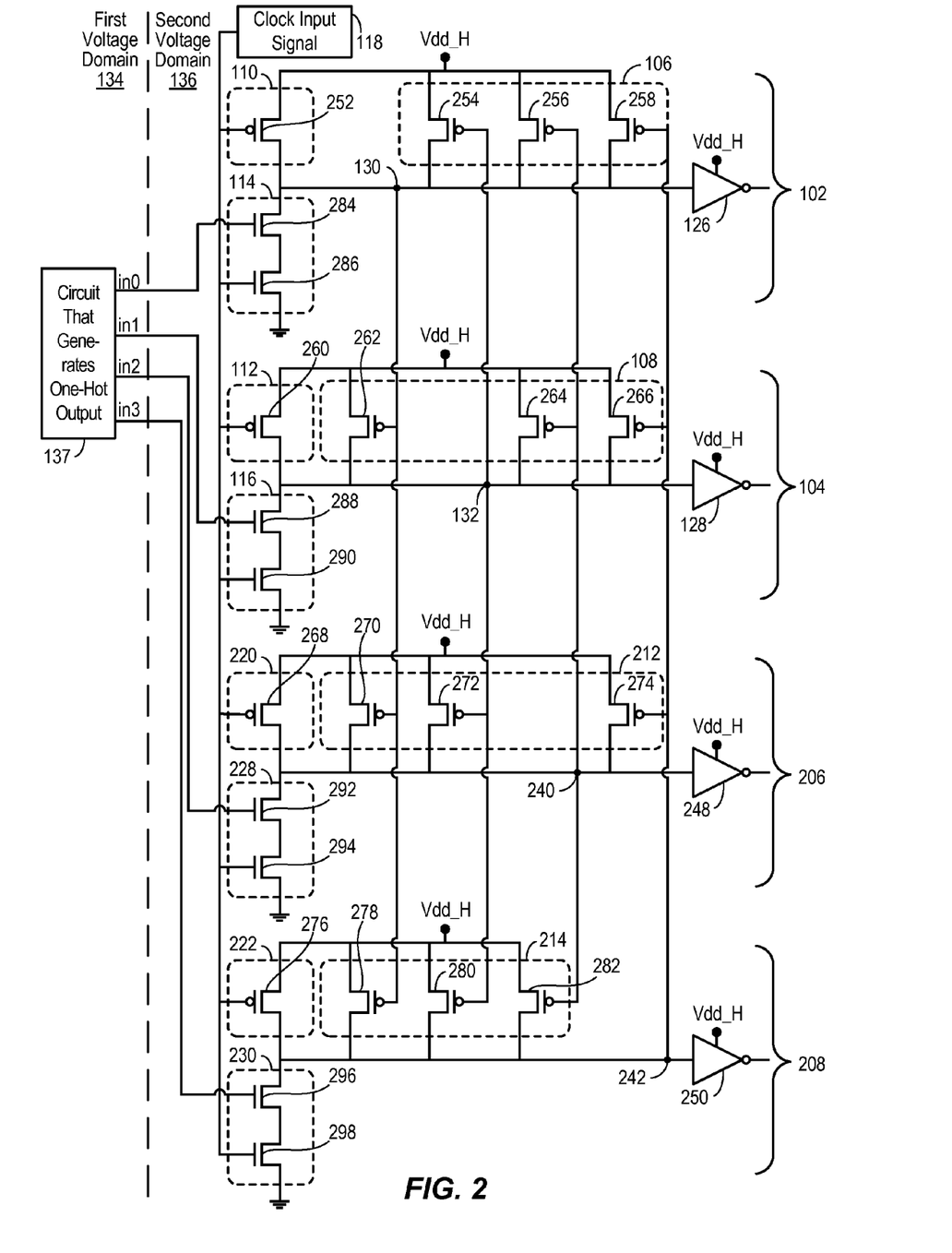
FIG. 2 is a diagram of a second illustrative embodiment of a system including dynamic circuit structures operating at multiple voltage levels.

The keeper circuits 106, 108 can include one or more pull-up devices, such as a P-channel Field Effect Transistor (PFET) configured to selectively couple one of the dynamic nodes 130-132 to the supply Vdd_H in response to a voltage at another of the dynamic nodes 130-132. For example, when the clock signal 118 has a logic high value, the dynamic nodes 130, 132 may gradually change state (from Vdd_H to ground) due to the leakage paths through N-channel FET (NFET) pull down devices. The keepers 106, 108 compensate for the leakage current and maintain the dynamic nodes 130, 132 at the Vdd_H level. An illustrative example of the keeper circuits 106, 108 is shown in FIG. 2. In a particular embodiment, because the keeper circuits 106, 108 are controlled by a voltage within the second voltage domain 136 (i.e. not by a signal from the first voltage domain 134), the keeper circuits 106, 108 enable voltage level shifting with improved voltage operation range among Vdd_L and Vdd_H domains. In addition, the process variation which affects keeper and NFET pull down transistor's driving strength (which depends on the PN ratio of keeper and NFET size) could be reduced or avoided. Further, the Vdd_L domain operation range may be lowed due to a ratioless design and may have no dependence on the gap between Vdd_H and Vdd_L.

During operation, the first and second dynamic nodes 130, 132 are precharged during a precharge time period during which the precharge circuits 110, 112 are enabled by the clock signal 118 and the discharge circuits 114, 116 are disabled by the clock signal 118. In response to the dynamic nodes 130, 132 being precharged, the keeper circuits 106, 108 are disabled.

Following the precharge of the dynamic nodes 130 and 132, only one of the first discharge circuit 114 and the second discharge circuit 116 is enabled by the discharge signal 124. The discharge signal 124 may be a "one-hot" signal where only one of multiple signals is asserted, i.e. "hot," at a time (i.e., each of the multiple discharge signals are mutually exclusive with respect to all other discharge signals). As a result, only one of the first discharge circuit 114 and the second discharge circuit 116 may be enabled during a discharge time period following the precharge time period.

In response to a transition of the clock signal 118, the precharge circuits 110, 112 are disabled and the discharge circuit 114 or 116 that receives the asserted discharge signal 124 is enabled. For example, when the first discharge circuit 114 is enabled via the discharge signal 124, the second discharge circuit 116 is not enabled. As a result, the first discharge circuit 114 discharges the first dynamic node 130. The second discharge circuit 116 is not enabled and does not discharge the second dynamic node 132.

The first dynamic node 130, in response to receiving the one-hot discharge signal 124 from the first voltage domain 134 (e.g. an input at Vdd_L), discharges to ground, causing the inverter 126 to provide a high value at the output 192 corresponding to the second voltage domain 136 (e.g. an output at Vdd_H). The second dynamic node 132, in response to receiving a low input from the first voltage domain 134 (e.g. at 0V), remains charged at a high voltage level in the second domain 136 (e.g. at Vdd_H), causing the inverter 128 to provide a low value at the output 194 (e.g. at 0V). Thus, the plurality of dynamic circuit structures 101 operates to shift a voltage level of a one-hot input signal from the first voltage domain 134 to a one-hot output signal corresponding to the second voltage domain 136.

Because the second dynamic node 132 remains at a logic high voltage level, the first keeper circuit 106 remains disabled during the discharge of the first dynamic node 130. As a result, there is no contention between the first keeper circuit 106 and the first discharge circuit 114 when discharging the first dynamic node 130.

In response to the discharge of the first dynamic node 130, the second keeper circuit 108 maintains the voltage level of the dynamic node 132 at or nearly at the precharge voltage level. That is, the second keeper circuit 108 may maintain the second dynamic node 132 at a logic high voltage level of the second voltage domain 136.

Thus, the plurality of dynamic circuit structures 101 can operate as a voltage level shifter, receiving a logic high signal from the first voltage domain 134 (i.e. the asserted discharge signal 124) and outputting a logic high signal of the second voltage domain 136 (i.e. the output 192 or 194). The precharge circuits 110, 112 and the keeper circuits 106, 108 are disabled during discharge of the dynamic node 130 or 132 to reduce or eliminate contention. Reducing contention during discharge may reduce power consumption and may increase a speed of operation. The voltage level shifter may operate with lower power, increased speed, larger operating range, lower Vdd_L, and reduced sensitivity to process variation than level shifter designs that include contention and/or that enable a keeper using signals from Vdd_L. Although FIG. 1 illustrates two representative dynamic circuit structures 102 and 104, in other embodiments the plurality of dynamic circuit structures 101 may include more than two dynamic circuit structures, such as illustrated in FIG. 2.

Referring to FIG. 2, an illustrative example of an implementation of the system of FIG. 1 is depicted. The system of FIG. 2 includes the circuit 137 in the first voltage domain 134 coupled to the first dynamic circuit structure 102 and to the second dynamic circuit structure 104 in the second voltage domain 136. The circuit 137 is also coupled to a third dynamic circuit structure 206 and to a fourth dynamic circuit structure 208 in the second voltage domain 136. The circuit 137 is configured to provide an asserted discharge signal from the first voltage domain 134 to a single one of the dynamic circuit structures 102, 104, 206, and 208 via lines in0, in1, in2, and in3, respectively.

The first precharge circuit 110 of the first dynamic circuit structure 102 includes a precharge transistor 252 illustrated as a P-channel Field Effect Transistor (PFET). The precharge transistor 252 has a first terminal coupled to a voltage supply Vdd_H (i.e. the second voltage domain 136), a second terminal coupled to the first dynamic node 130, and a gate terminal coupled to receive the clock signal 118.

The first discharge circuit 114 includes a first discharge transistor 284 and a second discharge transistor 286 illustrated as N-channel FETs (NFETs). The first discharge transistor 284 has a first terminal coupled to the first dynamic node 130, a second terminal coupled to the second discharge transistor 286, and a gate terminal coupled to receive the in0 signal from the circuit 137. The second discharge transistor 286 has a first terminal coupled to the first discharge transistor 284, a second terminal coupled to a reference voltage supply (i.e. a ground terminal), and a gate terminal coupled to receive the clock input signal 118.

The first keeper circuit 106 includes a first keeper transistor 254, a second keeper transistor 256, and a third keeper transistor 258, illustrated as PFETs. Each keeper transistor 254-258 has a first terminal coupled to Vdd_H and a second terminal coupled to the first dynamic node 130. The first keeper transistor 254 has a gate terminal coupled to the second dynamic node 132 of the second dynamic circuit structure 104. The second keeper transistor 256 has a gate terminal coupled to a third dynamic node 240 of the third dynamic circuit structure 206. The third keeper transistor 258 has a gate terminal coupled to a fourth dynamic node 242 of the fourth dynamic circuit structure 208.

The first keeper circuit 106 is enabled by a discharge of any of the dynamic nodes 132, 240, and 242 of the other dynamic circuit structures 104, 206, and 208, respectively. For example, when the second dynamic node 132 discharges, the first keeper transistor 254 couples the first dynamic node 130 to Vdd_H. When none of the dynamic nodes 132, 240, and 242 are discharged, the first keeper circuit 106 is disabled, decoupling the first dynamic node 130 from Vdd_H and enabling the first dynamic node 130 to discharge without contention from the first keeper circuit 106.

The dynamic circuit structures 104, 206, and 208 are similar to the first dynamic circuit structure 102. For example, the second precharge circuit 112 of the second dynamic circuit structure 104 includes a precharge transistor 260 responsive to the clock signal 118. The second discharge circuit 116 includes a first discharge transistor 288 responsive to the in1 signal from the circuit 137 and a second discharge transistor 290 responsive to the clock signal 118. The second keeper circuit 108 includes keeper transistors 262, 264, and 266 coupled in parallel between Vdd_H and the second dynamic node 132. Each keeper transistor 262, 264, and 266 is responsive to a voltage at a dynamic node 130, 240, and 242 of another dynamic circuit structure 102, 206, and 208, respectively.

The third dynamic circuit structure 206 includes the third dynamic node 240 coupled to a third precharge circuit 220, a third discharge circuit 228, and a third keeper circuit 212. An inverter 248 is coupled to the third dynamic node 240 to provide an output. The third precharge circuit 220 includes a precharge transistor 268 responsive to the clock signal 118. The third discharge circuit 228 includes a first discharge transistor 292 responsive to the in2 signal from the circuit 137 and a second discharge transistor 294 responsive to the clock signal 118. The third keeper circuit 212 includes keeper transistors 270, 272, and 274 coupled in parallel between Vdd_H and the third dynamic node 240. Each keeper transistor 270, 272, and 274 is responsive to a voltage at a dynamic node 130, 132, and 242 of another dynamic circuit structure 102, 104, and 208, respectively.

The fourth dynamic circuit structure 208 includes the fourth dynamic node 242 coupled to a fourth precharge circuit 222, a fourth discharge circuit 230, and a fourth keeper circuit 214. An inverter 250 is coupled to the fourth dynamic node 242 to provide an output. The fourth precharge circuit 222 includes a precharge transistor 276 responsive to the clock signal 118. The fourth discharge circuit 230 includes a first discharge transistor 296 responsive to the in3 signal from the circuit 137 and a second discharge transistor 298 responsive to the clock signal 118. The fourth keeper circuit 214 includes keeper transistors 278, 280, and 282 coupled in parallel between Vdd_H and the fourth dynamic node 242. Each keeper transistor 278, 280, and 282 is responsive to a voltage at a dynamic node 130, 132, and 240 of another dynamic circuit structure 102, 104, and 206, respectively.

Figure 3:
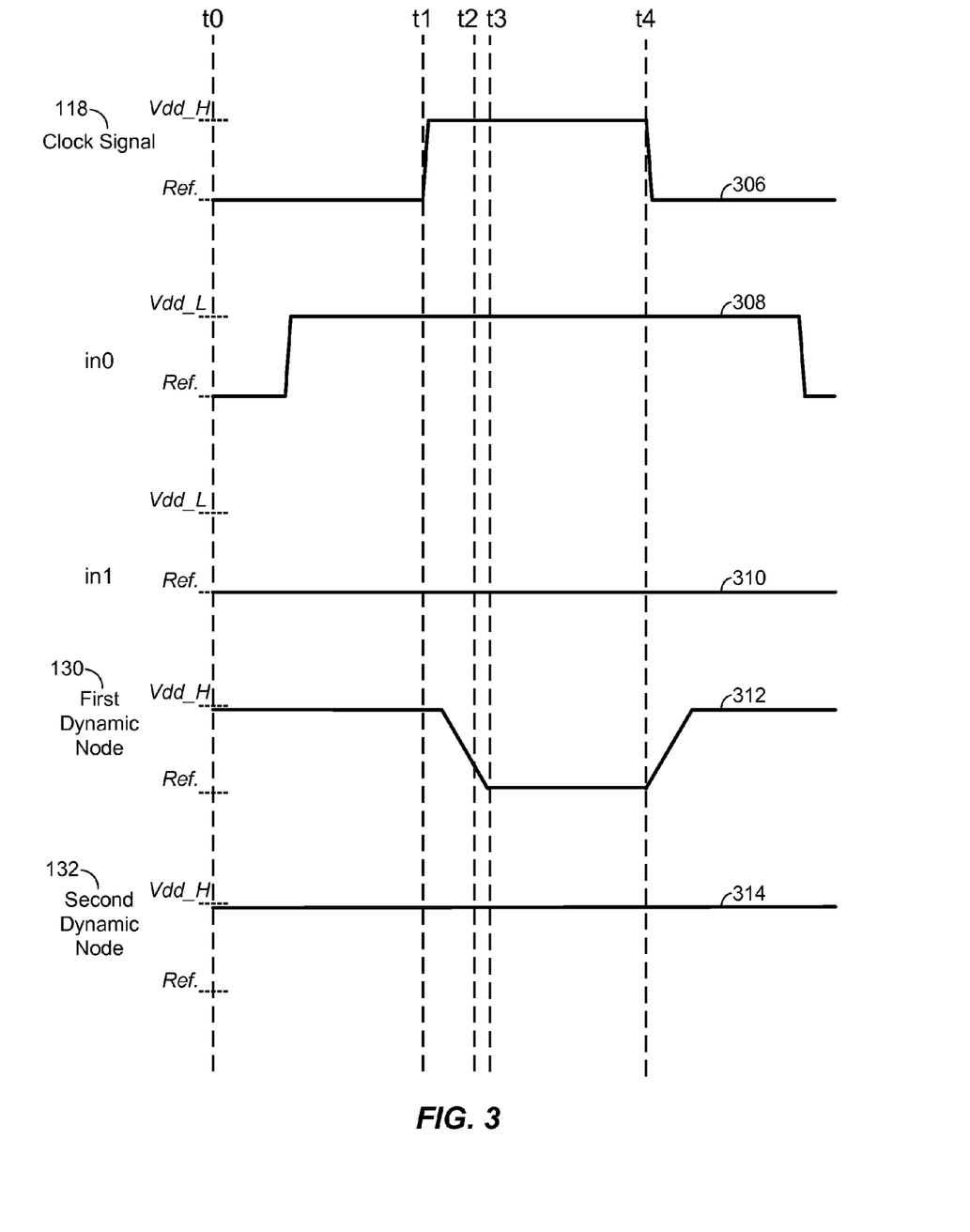
FIG. 3 is an illustration of a timing diagram corresponding to the system of FIG. 2.

An example of an operation of the first and second dynamic circuit structures 102 and 104 is described with respect to FIG. 3. Although four dynamic circuit structures 102, 104, 206, and 208 are depicted in the example of FIG. 2 for explanatory purposes, readers of skill in the art will recognize that a system configured to operate as the system of FIG. 2 may include N dynamic circuit structures. The keeper circuit of each of the N dynamic circuit structures may be configured with N−1 keeper enable transistors, where each of the N−1 keeper enable transistors is tied to the dynamic node of the other dynamic circuit structures. In addition, although FIG. 2 illustrates an example of an implementation using a particular arrangement of PFETs and NFETs, other implementations may include the system of FIG. 2 modified by interchanging PFETs and NFETs and reversing the polarity of each voltage supply and signal (i.e. interchanging logic high voltages with logic low voltages).

Referring to FIG. 3, an illustration of a timing diagram corresponding to the system of FIG. 2 is depicted. The timing diagram of FIG. 3 includes traces 306, 308, 310, 312, and 314 illustrating voltage levels of the clock signal 118, the signals in0 and in1 of the circuit 137, the first dynamic node 130 and the second dynamic node 132, respectively, as functions of time.

A time t0 represents a beginning of a precharge time period. At time t0, each of the traces 306-310 is illustrated at a ground reference voltage (i.e. a logic low voltage level) and traces 312 and 314 are at a logic high voltage level of the second voltage domain 136 (e.g. at Vdd_H). Between t0 and t1, the clock signal 118 at the logic low voltage level disables the first discharge circuit 114 and causes the first precharge circuit 110 to couple the first dynamic node 130 to Vdd_H, holding the first dynamic node 130 at Vdd_H. The clock signal 118 at the logic low voltage level also disables the second discharge circuit 116 and causes the second precharge circuit 112 to couple the second dynamic node 132 to Vdd_H, holding the second dynamic node 132 at Vdd_H.

Also between t0 and t1, the signal in0 transitions from the ground reference voltage to Vdd_L, the logic high voltage level of the first voltage domain 134. Because in0 and in1 are provided by the one-hot decoder 137, only one of in0 and in1 may be at Vdd_L at a time.

At time t1 the clock signal 118 transitions from the ground reference voltage to Vdd_H, indicating the beginning of a discharge time period. In response to the clock signal 118 at the logic high level, the precharge circuits 110 and 112 are disabled. Responsive to the clock signal 118 and in0 both at high logic voltage levels (although from different voltage domains), the first discharge circuit 114 discharges the first dynamic node 130. The second discharge circuit 116 responsive to the logic low voltage level of in1 remains disabled because the logic low levels of the first voltage domain 134 and the second voltage domain 136 are substantially the same (e.g. 0V), preventing discharge of the second dynamic node 132 during the discharge time period.

Because in0, at a high logic level from the first voltage domain 134 (e.g. at Vdd_L), is used to turn on the first discharge transistor 284 and is not used to turn off a PFET, level shifting can be performed at a lower value of Vdd_L than in implementations where PFETs (e.g. keeper devices) are controlled by signals from the Vdd_L domain. In addition, because the keeper devices 254, 256 and 258 are off, NFETs 284 and 286 can discharge the first dynamic node 130 without contention from the keeper circuit 106.

In contrast to the system of FIG. 2, in conventional systems that have a node that discharges through an NFET in contention with a PFET keeper, low values of a voltage source applied to the NFET gate may cause a discharge current to be comparable to a keeper current, slowing a speed of operation and setting a lower limit on the voltage source. In such conventional systems, a ratio between the NFET and the PFET may be critical for operation and may cause the conventional voltage shifter to be susceptible to process variations.

As the first dynamic node 130 is discharging, at time t2 the first dynamic node 132 transitions from a logic high voltage level to a logic low voltage level. Between t1 and t2 of the timing diagram, the first keeper circuit 106 is not enabled because the second dynamic node 132 remains at Vdd_H. In this way, there is no contention between the first keeper circuit 106 and the first discharge circuit 114 during discharge of the first dynamic node 130. In addition, the second keeper circuit 108 remains disabled between t1 and t2 while the first dynamic node 130 is discharging but is still above the logic low voltage level. Although the second dynamic node 132 remains precharged during the discharge time period, eventually a current leakage may cause a reduction in the voltage level at the second dynamic node 132. To ensure that the second dynamic node 132 remains at a logic high voltage level, the second keeper circuit 108 is enabled at t2. The first dynamic node 130 is substantially discharged at time t3.

The second keeper circuit 108 is controlled by the first dynamic node 130 from the second voltage domain 136. As a result, the second keeper circuit 108 operates substantially independent of a voltage level of the first voltage domain 134. Thus, level shifting operation is enabled at lower Vdd_L values than conventional level shifter circuits that have a stack keeper responsive to an input signal from a Vdd_L domain, which may be more susceptible to process variations and performance issues as a difference between Vdd_H and Vdd_L exceeds a threshold voltage of the stack keeper.

Between times t3 and t4 of the timing diagram, the traces 306-314 remain at a substantially steady state and the output of the circuits may be evaluated during an evaluation time period. At time t4, the clock signal 118 transitions to the ground reference voltage and a next precharge time period begins. In response to the transition of the clock signal 118 at time t4, the discharge circuits 114, 116 are disabled and the precharge circuits 110, 112 are enabled. The first keeper circuit 106 remains disabled, and the second keeper circuit 108 is disabled in response to the first dynamic node 130 precharging to the logic high voltage level. The discharge signal may be de-asserted from in0 and may be asserted at another of the one-hot signals in1-in3 in preparation for a next discharge period.

To illustrate principles of operation, the traces 306-314 may depict voltage levels and transitions between Vdd_H, Vdd_L, and the ground reference voltage under ideal or near-ideal conditions. In operation, one or more of the voltages depicted may deviate from the illustrated embodiment. For example, the first dynamic node 130 may not fully discharge to the ground reference voltage due to a non-zero voltage across the discharge transistors 284 and 286 of FIG. 2. Thus, the embodiment of FIG. 3 is presented for purposes of explanation and not of limitation.

Figure 4:
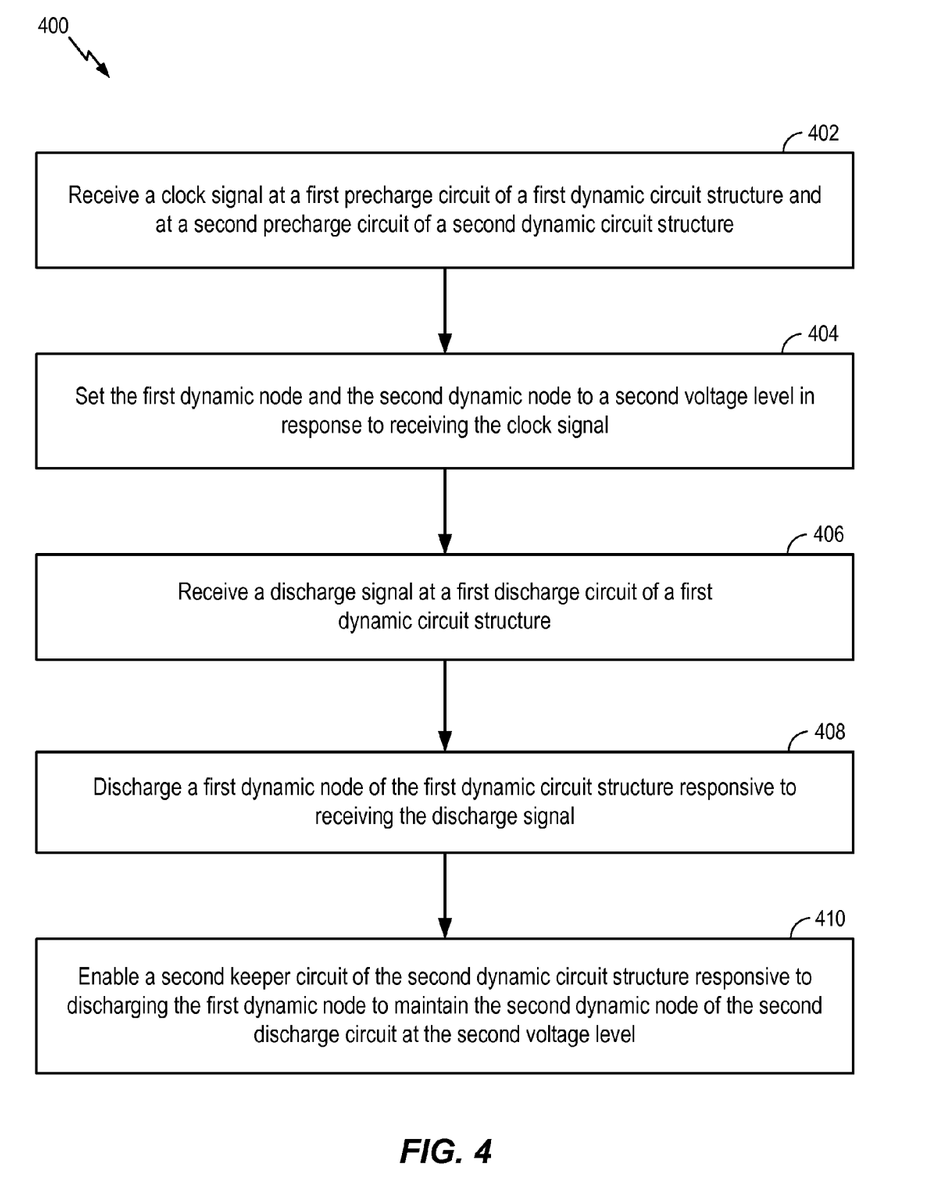
FIG. 4 is a flow diagram of a particular illustrative embodiment of a method of operating a dynamic circuit structure at multiple voltage levels.

Referring to FIG. 4, a flow diagram of a first illustrative embodiment of a method of operating a dynamic circuit structure with reduced keeper circuit-discharge circuit contention is depicted. The dynamic circuit structure may operate to level shift a one-hot signal from a first voltage level (e.g. Vdd_L) to a second voltage level (e.g. Vdd_H).

A clock signal may be received at a first precharge circuit of a first dynamic circuit structure and at a second precharge circuit of a second dynamic circuit structure, at 402. For example, the clock signal may be the clock signal 118 of FIG. 1 that is received at the first precharge circuit 110 of the first dynamic circuit structure 102 and at the second precharge circuit 112 of the second dynamic circuit structure 104.

A first dynamic node of the first dynamic circuit structure and a second dynamic node of the second dynamic circuit structure may be set to the second voltage level in response to receiving the clock signal, at 404. For example, setting the first dynamic node to the second voltage level may include coupling a voltage source (e.g. a Vdd_H source) to the first dynamic node via a first precharge transistor, such as the precharge transistor 252 of FIG. 2. Setting the second dynamic node to the second voltage level may include coupling the voltage source to the second dynamic node via a second precharge transistor, such as the precharge transistor 260 of FIG. 2.

A discharge signal is received at a first discharge circuit of the first dynamic circuit structure, at 406. The first dynamic node may be at the second voltage level and the first keeper circuit may be disabled when the discharge signal is received, such as described with respect to the trace 312 of FIG. 3 when the discharge signal is received between t0 and t1. The discharge signal may be the discharge signal 124 of FIG. 1. The discharge signal may be received from a one-hot decoder circuit. In a particular embodiment, the discharge signal may be received from the circuit 137 of FIG. 1. The discharge signal is at a first voltage level that is different from the second voltage level.

The first dynamic node is discharged responsive to receiving the discharge signal, at 408. For example, the first discharge circuit may include a stacked pair of discharge transistors coupled to a reference voltage, such as the discharge transistors 284 and 286 of FIG. 2. Discharging the first dynamic node may include coupling the first dynamic node to the reference voltage, such as by applying a Vdd_L voltage from the circuit 137 to a gate of the first discharge transistor 284 and applying a Vdd_H voltage from the clock signal 118 to a gate of the second discharge transistor 286.

A second keeper circuit of the second dynamic circuit structure is enabled responsive to discharging the first dynamic node to maintain the second dynamic node of the second dynamic circuit structure at the first voltage level, at 410. For example, the second keeper circuit may maintain the second dynamic node at the second voltage level by coupling the second dynamic node to a voltage source. To illustrate, the second keeper circuit 108 of FIG. 2 may couple the second dynamic node 132 to Vdd_H in response to the keeper transistor 262 receiving a low logic level voltage from the discharged first dynamic node 130.

The first dynamic circuit structure and the second dynamic circuit structure may be included in a plurality of dynamic circuit structures. The plurality of dynamic circuit structures may include N dynamic circuit structures, and each dynamic circuit structure of the N dynamic circuit structures may include a keeper circuit having N−1 keeper transistors.

In a particular embodiment, receiving the discharge signal, discharging the first dynamic node, and enabling the second keeper circuit are performed at a processor integrated into an electronic device. Persons of skill in the art will also recognize that systems of FIGS. 1-2 may be implemented in a semiconductor die. Such a semiconductor die may be part of a processor, part of a memory circuit, or part of another circuit that is integrated into one or more electronic devices. The one or more electronic devices, for example, may be selected from a group of a set top box, a music player, a video player, an entertainment unit, a navigation device, a communications device, a personal digital assistant (PDA), a fixed location data unit, and a computer. As another illustrative, non-limiting example, the one or more electronic devices may be remote units such as mobile phones, hand-held personal communication systems (PCS) units, portable data units such as personal data assistants (PDA), global positioning system (GPS) enabled devices, navigation devices, fixed location data units such as meter reading equipment, any other device, or any combination thereof. Examples of such electronic devices are depicted in FIGS. 5-6.

Figure 5:
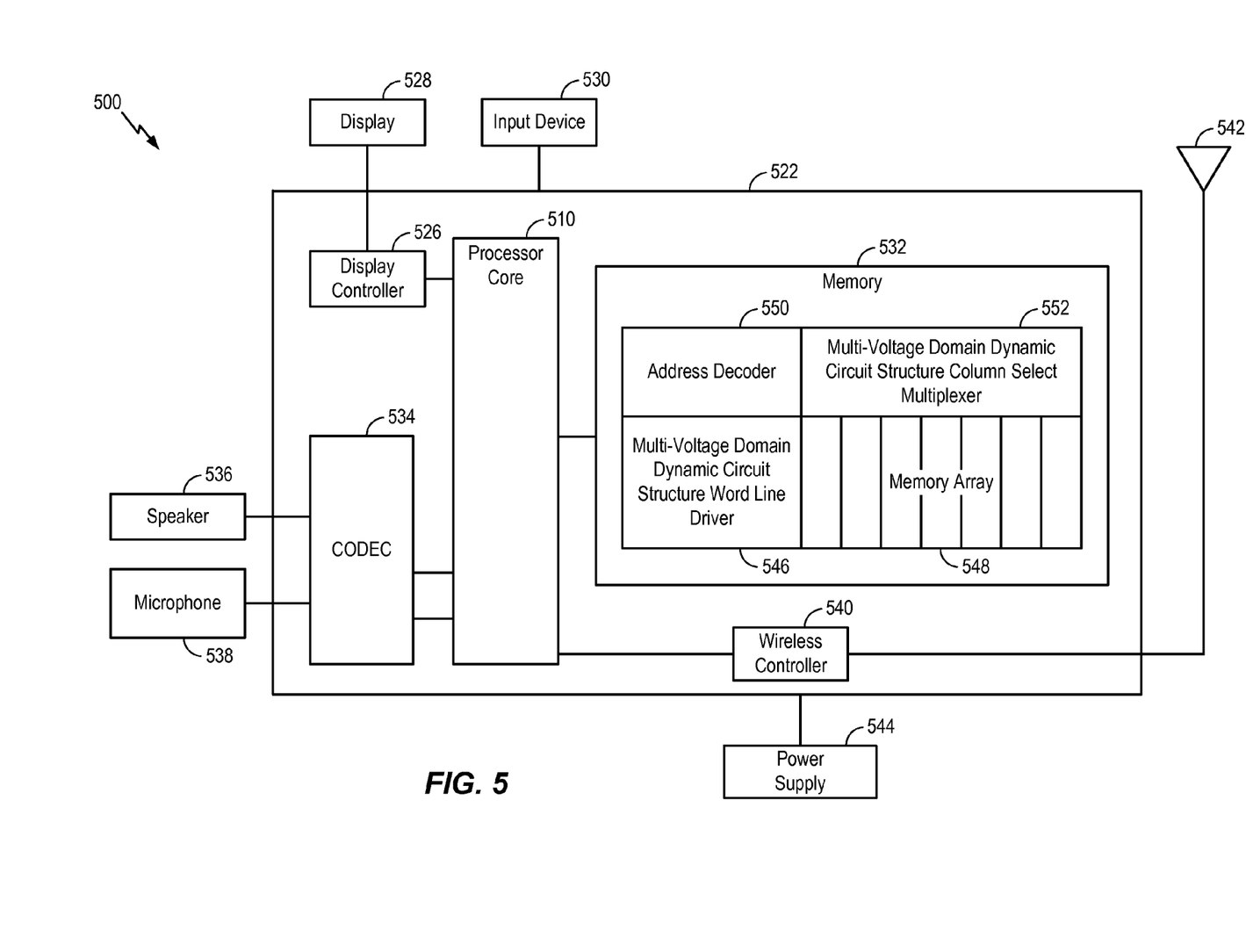
FIG. 5 is a block diagram of a first particular embodiment of a system that includes a multi-voltage domain, multi-dynamic circuit structure device.
Figure 6:
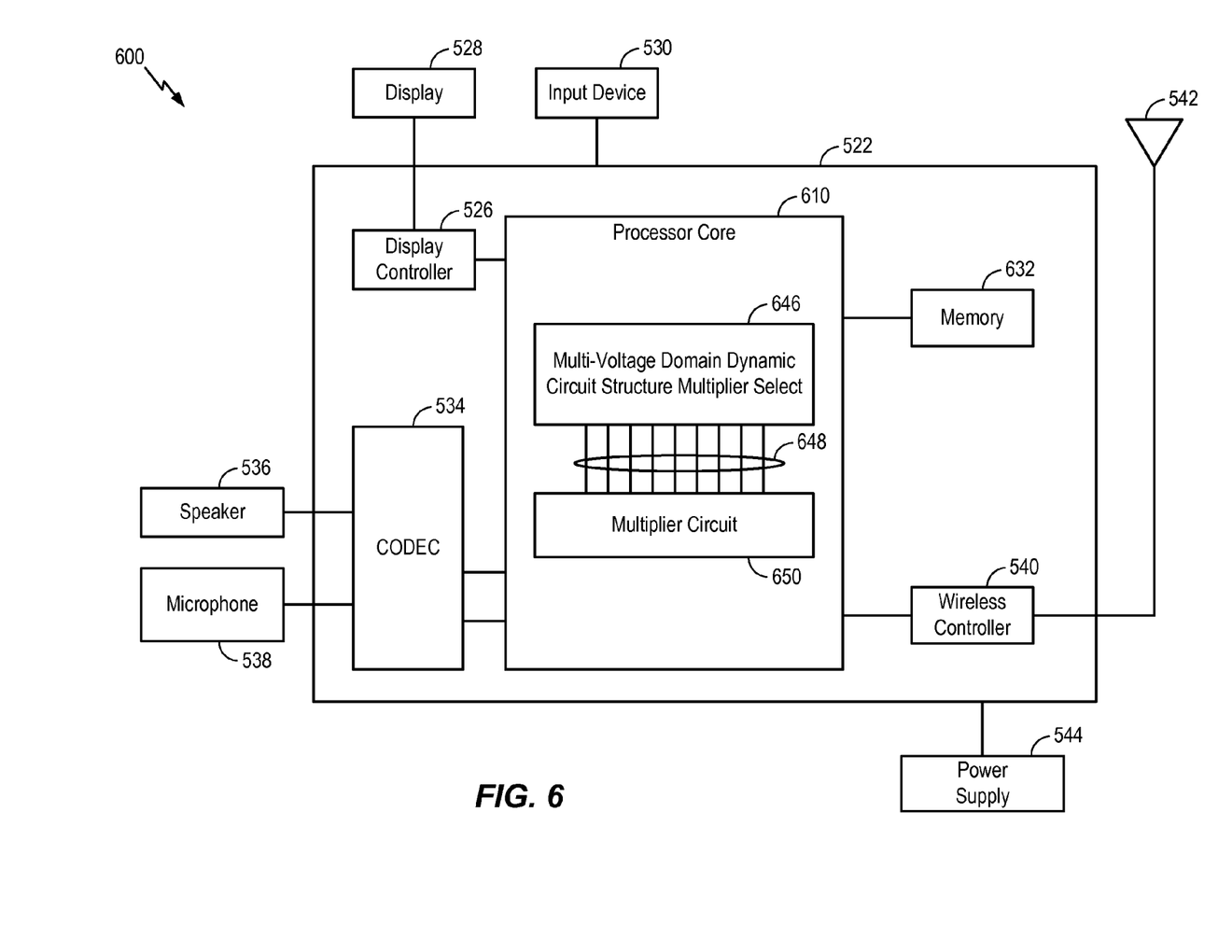
FIG. 6 is a block diagram of a second particular embodiment of a system that includes a multi-voltage domain, multi-dynamic circuit structure device.

FIG. 5 is a block diagram of a first particular embodiment of a system 500 that includes two multi-voltage domain dynamic circuit structure devices 546, 552. The system 500 may be implemented in a portable electronic device and includes a processor core 510, such as one or more general purpose processors or digital signal processors (DSPs), coupled to a computer readable medium, such as a memory 532, storing computer readable instructions and data. The memory 532 includes a memory array 548, an address decoder 550 and two dynamic driver circuits: a column select multiplexer circuit 552 and a wordline driver circuit 546. Each of the column select multiplexer circuit 552 and the wordline driver circuit 546 includes a multi-domain dynamic circuit structure device similar to the system depicted in FIG. 1 or the system depicted in FIG. 2. For example, each of the column select multiplexer circuit 552 and the wordline driver circuit 546 may function as a level shifter to perform a level shifting of a one-hot signal between a logic domain and a core memory domain.

The system 500 also includes a display controller 526 coupled to the processor core 510 and to a display device 528. A coder/decoder (CODEC) 534 can also be coupled to the processor core 510. A speaker 536 and a microphone 538 can be coupled to the CODEC 534. A wireless controller 540 can be coupled to the processor core 510 and to a wireless antenna 542.

In a particular embodiment, the processor core 510, the display controller 526, the memory 532, the CODEC 534, and the wireless controller 540 are included in a system-in-package or system-on-chip device 522. In a particular embodiment, an input device 530 and a power supply 544 are coupled to the system-on-chip device 522. Moreover, in a particular embodiment, as illustrated in FIG. 5, the display device 528, the input device 530, the speaker 536, the microphone 538, the wireless antenna 542, and the power supply 544 are external to the system-on-chip device 522. However, each of the display device 528, the input device 530, the speaker 536, the microphone 538, the wireless antenna 542, and the power supply 544 can be coupled to a component of the system-on-chip device 522, such as an interface or a controller.

FIG. 6 is a block diagram of a particular embodiment of a system 600 that includes a multi-voltage domain dynamic circuit structure device 646. The system 600 may be implemented in a portable electronic device and includes the system-on-chip device 522 of FIG. 5 including the display controller 526, the CODEC 534, and the wireless controller 540, and also including a memory 632 coupled to a processor core 610. The input device 530, the display 528, the speaker 536, the microphone 538, and the power supply 544 may be coupled to the system-on-chip device 522.

The processor core 610 includes a multiplier select circuit 646 and a multiplier circuit 650. Coupling the multiplier select circuit 646 and the multiplier circuit 650 are a number of multiplier select lines 648. The multiplier select circuit 646 is configured with a multi-domain dynamic circuit structure device similar to the system depicted in FIG. 1 or the system depicted in FIG. 2.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer magnetoresistive random access memory (STT-MRAM), flash memory, read-only memory (ROM), programmable read-only memory (PROM), erasable programmable read-only memory (EPROM), electrically erasable programmable read-only memory (EEPROM), registers, a hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a first dynamic circuit structure comprising a first keeper circuit, a first discharge circuit, and a first precharge circuit, wherein the first keeper circuit, the first discharge circuit, and the first precharge circuit are coupled to a first dynamic node and wherein the first precharge circuit is configured to precharge the first dynamic node to a precharge voltage level; and
   a second dynamic circuit structure comprising a second keeper circuit, a second discharge circuit, and a second precharge circuit, wherein the second keeper circuit, the second discharge circuit, and the second precharge circuit are coupled to a second dynamic node and wherein the second keeper circuit is further coupled to the first dynamic node,
   wherein the first dynamic circuit structure receives an asserted discharge signal during a discharge time period, the asserted discharge signal at a discharge voltage level different than the precharge voltage level, and
   wherein a single one of the first dynamic circuit structure and the second dynamic circuit structure that receives the asserted discharge signal operates as a level shifter to generate an output signal to a second voltage domain in response to receiving the asserted discharge signal from a first voltage domain.

2. The apparatus of claim 1, wherein the first keeper circuit is not enabled during a discharge of the first dynamic node.

3. The apparatus of claim 1, wherein the second keeper circuit is enabled responsive to a discharge of the first dynamic node.

4. The apparatus of claim 1, wherein:
   during a precharge time period, the first dynamic node and second dynamic node are precharged to a logic high voltage level of the second voltage domain; and
   during a discharge time period following the precharge time period, one of the first dynamic node and the second dynamic node corresponding to the single one of the first dynamic circuit structure and the second dynamic circuit structure discharges to a logic low voltage level and the other of the first dynamic node and second dynamic node is held at the logic high voltage level of the second voltage domain.

5. The apparatus of claim 1, wherein the first keeper circuit is configured to maintain a voltage level of the first dynamic node and wherein the second keeper circuit is configured to maintain a voltage level of the second dynamic node.

6. The apparatus of claim 1 integrated in at least one semiconductor die.

7. The apparatus of claim 1, further comprising a device selected from the group consisting of a set top box, a music player, a video player, an entertainment unit, a navigation device, a communications device, a personal digital assistant (PDA), a fixed location data unit, and a computer, into which the first dynamic circuit structure and the second dynamic circuit structure are integrated.

8. An apparatus comprising:
   a plurality of dynamic circuit structures;
   wherein each dynamic circuit structure of the plurality of dynamic circuit structures comprises a dynamic node configured to be precharged to a precharge voltage level, a keeper circuit, a discharge circuit, and a precharge circuit;
   wherein the dynamic node of a first dynamic circuit structure of the plurality of dynamic circuit structures is coupled to the keeper circuit of each of the other dynamic circuit structures of the plurality of dynamic circuit structures;
   wherein a single one of the plurality of dynamic circuit structures receives an asserted discharge signal during a discharge time period, the asserted discharge signal at a discharge voltage level different than the precharge voltage level; and
   wherein, for each particular dynamic circuit structure of the plurality of dynamic circuit structures:
       the precharge circuit of the particular dynamic circuit structure is responsive to a clock signal from a second voltage domain; and
       the discharge circuit of the particular dynamic circuit structure is responsive to the clock signal and to the discharge signal from a first voltage domain.

9. The apparatus of claim 8, wherein the discharge circuit of each particular dynamic circuit structure of the plurality of dynamic circuit structures is responsive to a corresponding output of a one-hot decoder circuit.

10. The apparatus of claim 8, wherein the discharge signal is a one-hot discharge signal from a first voltage domain, and wherein each dynamic circuit structure of the plurality of dynamic circuit structures is in a second voltage domain and is responsive to the one-hot discharge signal.

11. The apparatus of claim 8, further comprising a memory device that includes a memory array and a dynamic driver circuit coupled to the memory array to drive a plurality of columns or word lines of the memory array, wherein the dynamic driver circuit comprises the plurality of dynamic circuit structures.

12. The apparatus of claim 8 integrated in at least one semiconductor die.

13. The apparatus of claim 8, further comprising a device selected from the group consisting of a set top box, a music player, a video player, an entertainment unit, a navigation device, a communications device, a personal digital assistant (PDA), a fixed location data unit, and a computer, into which the plurality of dynamic circuit structures is integrated.

14. An apparatus comprising:
first means for precharging a first dynamic node of a first dynamic circuit structure to a precharge voltage level;
second means for precharging a second dynamic node of a second dynamic circuit structure to the precharge voltage level;
first means for maintaining the first dynamic node at the precharge voltage level in response to a discharge of the second dynamic node;
second means for maintaining the second dynamic node at the precharge voltage level in response to a discharge of the first dynamic node;
means for discharging a single one of the first dynamic node and the second dynamic node responsive to a discharge signal at a discharge voltage level,
wherein a single one of the first means for precharging and the second means for precharging, a single one of the first means for maintaining and the second means for maintaining, and the means for discharging operate as a level shifter to generate an output signal to a second voltage domain in response to receiving the discharge signal from a first voltage domain, and
wherein the precharge voltage level and the discharge voltage level are different.

15. The apparatus of claim 14 integrated in at least one semiconductor die.

16. The apparatus of claim 14, further comprising a device selected from the group consisting of a set top box, a music player, a video player, an entertainment unit, a navigation device, a communications device, a personal digital assistant (PDA), a fixed location data unit, and a computer, into which the means for precharging the first dynamic node and the means for precharging the second dynamic node are integrated.

17. A method, comprising:
receiving a discharge signal at a first discharge circuit of a first dynamic circuit structure, wherein the first dynamic circuit structure comprises a first dynamic node and a first keeper circuit, wherein the discharge signal comprises a first voltage level and the first dynamic node is at a second voltage level different from the first voltage level, and wherein the first keeper circuit is disabled when the discharge signal is received;
discharging the first dynamic node responsive to receiving the discharge signal; and
enabling a second keeper circuit of a second dynamic circuit structure responsive to discharging the first dynamic node to maintain a second dynamic node of the second dynamic circuit structure at the second voltage level.

18. The method of claim 17, further comprising:
receiving a clock signal at a first precharge circuit of the first dynamic circuit structure and at a second precharge circuit of the second dynamic circuit structure; and
setting the first dynamic node and the second dynamic node to the second voltage level in response to receiving the clock signal.

19. The method of claim 18, wherein setting the first dynamic node and the second dynamic node to the second voltage level comprises coupling a voltage source to the first dynamic node via a first precharge transistor and coupling the voltage source to the second dynamic node via a second precharge transistor.

20. The method of claim 17, wherein the first discharge circuit comprises a stacked pair of discharge transistors coupled to a reference voltage and wherein discharging the first dynamic node comprises coupling the first dynamic node to the reference voltage.

21. The method of claim 17, wherein the second keeper circuit maintains the second dynamic node at the second voltage level by coupling the second dynamic node to a voltage source.

22. The method of claim 17, wherein the discharge signal is received from a one-hot decoder circuit.

* * * * *